(12) United States Patent
Lustig (10) Patent No.: US 9,788,414 B2
(45) Date of Patent: Oct. 10, 2017

(54) ARRANGEMENT FOR CONNECTING

(71) Applicant: General Electric Company, Schenectady, NY (US)

(72) Inventor: James Michael Lustig, Newbury, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/298,332

(22) Filed: Oct. 20, 2016

(65) Prior Publication Data

US 2017/0042021 A1 Feb. 9, 2017

Related U.S. Application Data

(63) Continuation of application No. 14/453,749, filed on Aug. 7, 2014, now Pat. No. 9,502,155.

(51) Int. Cl.
| | |
|---|---|
| *H05K 9/00* | (2006.01) |
| *H05K 1/02* | (2006.01) |
| *H01B 7/282* | (2006.01) |
| *H01B 7/29* | (2006.01) |
| *F23N 5/08* | (2006.01) |
| *H01R 13/6592* | (2011.01) |

(52) U.S. Cl.
CPC ........... *H05K 1/0221* (2013.01); *F23N 5/082* (2013.01); *H01B 7/282* (2013.01); *H01B 7/29* (2013.01); *H01R 13/6592* (2013.01); *H05K 9/00* (2013.01); *H05K 9/0084* (2013.01)

(58) Field of Classification Search
None
See application file for complete search history.

(56) References Cited

U.S. PATENT DOCUMENTS

| | | |
|---|---|---|
| 4,492,114 A | 1/1985 | Yamanaka |
| 6,847,219 B1 | 1/2005 | Lesher |
| | (Continued) | |

FOREIGN PATENT DOCUMENTS

CN 103968954 A 8/2014

OTHER PUBLICATIONS

A PCT Search Report and Written Opinion issued in connection with corresponding Application No. PCT/US2015038722 on Oct. 9, 2015. Cited in parent application.

*Primary Examiner* — Dimary Lopez Cruz
(74) *Attorney, Agent, or Firm* — Cooper Legal Group LLC (57) ABSTRACT

An arrangement for connecting a sensor assembly and a cable assembly. The arrangement includes a signal wire. The arrangement includes a transversely-extending insulating barrier. The signal wire extends through the insulating barrier. The arrangement includes a shield wire that is configured to provide at least part of a grounding pathway. The shield wire extends through the insulating barrier at a location spaced from the signal wire. The arrangement includes at least one conductive layer that is located upon the insulating barrier. The at least one conductive layer is spaced away from the signal wire and is in electrical contact with the shield wire. At least a portion of the insulating barrier has a non-linear profile. At least a portion of the at least one conductive layer that is located upon the at least a portion of the insulating barrier has the non-linear profile.

19 Claims, 3 Drawing Sheets

(56) References Cited

U.S. PATENT DOCUMENTS

2013/0318994 A1* 12/2013 Hoffman .............. F23M 11/045
  60/779
2014/0034377 A1    2/2014 Kamal Vij
2014/0124260 A1    5/2014 Blakemore et al.
2014/0216155 A1    8/2014 Olechnowicz et al.

* cited by examiner

ARRANGEMENT FOR CONNECTING

REALATED APPLICATIONS

This application is a Continuation and benefit of priority is claimed herein from U.S. patent application Ser. No. 14/453,749 filed Aug. 7, 2014, now U.S. Pat. No. 9,502,155, the entire disclosure of which is incorporated herein by reference.

BACKGROUND OF THE INVENTION

Field of the Invention

The present invention relates generally to an arrangement for connecting, and specifically to an arrangement for connecting a sensor assembly and a cable assembly.

Discussion of the Prior Art

Within an oil or gas fueled turbine (combustion chamber), fuel is fed into a combustion chamber within which an ignition flame is present. If the flame becomes extinguished, commonly referred to as a flame-out condition, it is undesirable for fuel to continue to be fed into the hot combustion chamber without appropriate ignition. Consequently, if the ignition flame is extinguished within the combustion chamber, the fuel feed into the combustion chamber should be quickly terminated and thus limit un-combusted fuel build up.

Flame sensing electronics are commonly associated with a flame sensor within the turbine arrangement. The flame sensing electronics may be temperature sensitive. Moreover, relatively small currents, including photocurrents, may be transmitted to the flame sensing electronics. These small currents may be susceptible to interference (e.g., electromagnetic, RF, etc.), moisture, etc. Accordingly, it would be useful to provide a seal assembly that houses a signal wire through which the photocurrent is transmitted, with the seal assembly protecting the signal wire and other internal electronic components from degradation due to interference, moisture, etc.

BRIEF DESCRIPTION OF THE INVENTION

The following presents a simplified summary of the invention in order to provide a basic understanding of some example aspects of the invention. This summary is not an extensive overview of the invention. Moreover, this summary is not intended to identify critical elements of the invention nor delineate the scope of the invention. The sole purpose of the summary is to present some concepts of the invention in simplified form as a prelude to the more detailed description that is presented later.

In accordance with one aspect, the present invention provides an arrangement for connecting a sensor assembly and a cable assembly. The arrangement includes a signal wire that is configured to convey a signal from the sensor assembly to the cable assembly. The arrangement includes an insulating barrier that extends transverse to the signal wire. The signal wire extends through the insulating barrier. The insulating barrier is at least part of a boundary separation between the sensor assembly and the cable assembly. The arrangement includes a shield wire that is configured to provide at least part of a grounding pathway between the sensor assembly and the cable assembly. The shield wire extends through the insulating barrier at a location spaced from the signal wire. The arrangement includes at least one conductive layer that is located upon the insulating barrier. The at least one conductive layer is spaced away from the signal wire and is in electrical contact with the shield wire. At least a portion of the insulating barrier has a non-linear profile. At least a portion of the at least one conductive layer that is located upon the at least a portion of the insulating barrier has the non-linear profile.

BRIEF DESCRIPTION OF THE DRAWINGS

The foregoing and other aspects of the present invention will become apparent to those skilled in the art to which the present invention relates upon reading the following description with reference to the accompanying drawings, in which.

DETAILED DESCRIPTION OF THE INVENTION

Example embodiments that incorporate one or more aspects of the present invention are described and illustrated in the drawings. These illustrated examples are not intended to be a limitation on the present invention. For example, one or more aspects of the present invention can be utilized in other embodiments and even other types of devices. Moreover, certain terminology is used herein for convenience only and is not to be taken as a limitation on the present invention. Still further, in the drawings, the same reference numerals are employed for designating the same elements.

Figure 1:
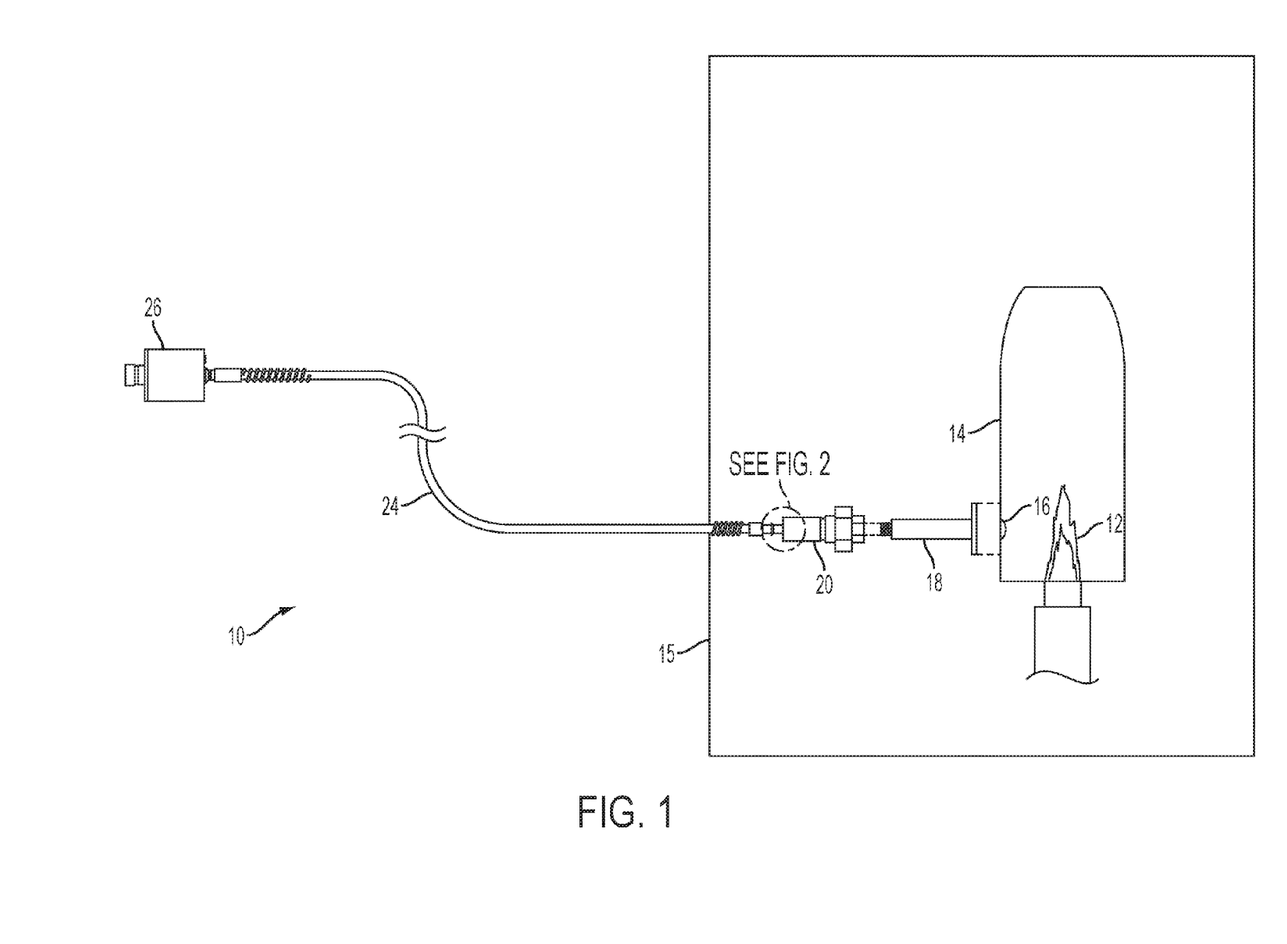
FIG. 1 is a partially exploded, schematized cross-section view of an example flame sensor apparatus in accordance with at least one aspect of the present invention.

FIG. 1 schematically illustrates an example flame sensor apparatus 10 for monitoring specific characteristics of a flame 12. The flame 12 is located within a combustion chamber 14 of a turbine 15. In an example, the flame 12 emits electromagnetic radiation energy. The combustion chamber 14 may include an opening 16 in proximity to the flame 12. As such, the flame 12 is at least partially visible through the opening 16.

The flame sensor apparatus 10 can, in some examples, include a sight tube 18. The sight tube 18 has a hollow internal bore and can be attached to the combustion chamber 14. In an example, the sight tube 18 is attached to the opening 16 in the combustion chamber 14, such that electromagnetic radiation energy can pass from the flame 12 and through the sight tube 18. It will be appreciated that the sight tube 18 is illustrated as being partially exploded/detached from the combustion chamber 14 in FIG. 1. In operation, however, the sight tube 18 can be attached (e.g., with a fastener, etc.) to the opening 16 of the combustion chamber 14.

The flame sensor apparatus 10 can include a sensor assembly 20. In some examples, it is beneficial for the sensor assembly 20 to define a hermetically sealed chamber (described in detail below). In general, the hermetically sealed chamber of the sensor assembly 20 is beneficial because a photodiode within the sensor assembly 20 generates a relatively small current. This relatively small current may be susceptible to moisture, which can compromise insulation resistance and, thus, make a signal unreliable. Moreover, electrical shielding within the sensor assembly 20 is beneficial to limit/reduce degradation of the relatively small current.

The sensor assembly 20 is operably connected to the combustion chamber 14 and can receive the electromagnetic radiation energy from the flame 12 through the sight tube 18. In an example, the sensor assembly 20 can include a photodiode (illustrated and described with respect to FIG. 2), which generates a current, such as a photocurrent, based on the electromagnetic radiation energy. This current can pass from the sensor assembly 20, through a cable assembly 24 and to an electrical assembly 26. The electrical assembly 26, in some examples, can include sensing electronics that can determine the flame's characteristics, such as the presence or absence of the flame 12.

Figure 2:
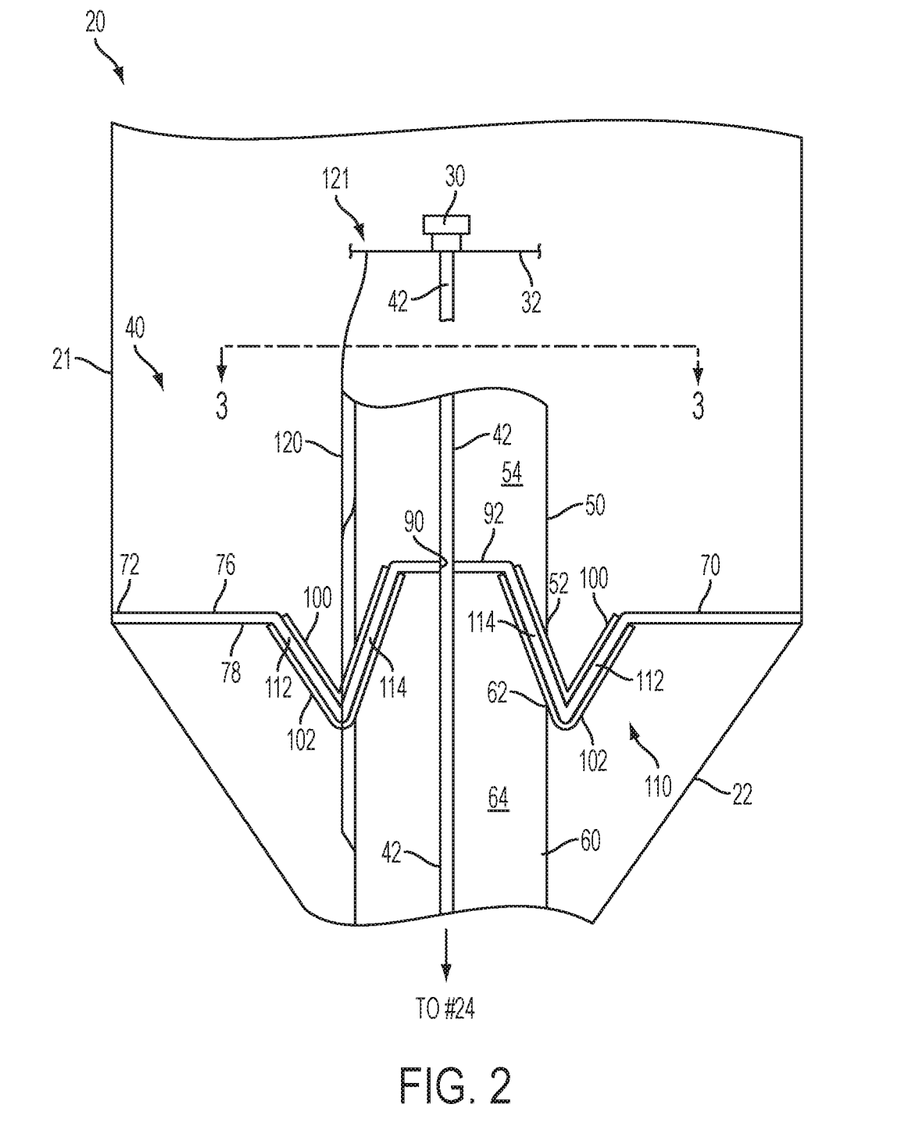
FIG. 2 is a partially torn open perspective view of an example seal assembly for use in the flame sensor apparatus of FIG. 1.

Turning to FIG. 2, a portion of the sensor assembly 20 is illustrated. It will be appreciated that only a portion of the sensor assembly 20, and not the entire sensor assembly 20, is illustrated in FIG. 2 for illustrative purposes. Indeed, in this example, the sensor assembly 20 may include any number of internal structures not illustrated in FIG. 2. For example, these internal structures of the sensor assembly 20 may include, but are not limited to, walls, chambers, fasteners, lenses, circuit boards, wires, conductors, or the like.

The sensor assembly 20 may include a housing 21. The housing 21 comprises a wall, surface, barrier, or the like separating an internal chamber of the sensor assembly 20 from an exterior of the sensor assembly 20. The housing 21 includes any number of materials, including metals or the like. In the illustrated example, a connection portion 22 can be provided. The connection portion 22 can be attached to the cable assembly 24 (also illustrated in FIG. 1) and to the housing 21. In one possible example, the connection portion 22 can be connected to an outer sheath of the cable assembly 24. In some examples, the connection portion 22 can define an electrical connection to the outer sheath of the cable assembly 24.

The sensor assembly 20 can include a photodiode 30 positioned within the sensor assembly 20. The photodiode 30 is illustrated generically/schematically in FIG. 2, as it is to be appreciated that the photodiode 30 includes any number of sizes, shapes, configurations, etc. In general, the photodiode 30 includes a solid state ultraviolet sensor that receives electromagnetic radiation energy from the sight tube 18. In some examples, the sensor assembly 20 includes one or more windows, lenses, etc., that can focus the electromagnetic radiation energy onto the photodiode 30.

The photodiode 30 receives the electromagnetic radiation energy and generates a current output signal, such as a photocurrent, based on the electromagnetic radiation energy. The photodiode 30 can generate a photocurrent that is proportional to the intensity level of the UV radiation received within a specific spectral bandwidth. This photocurrent can be relatively low, such as in a range of about $10^{-10}$ amperes. In one example, the current output signal, which may include a signal, can be delivered from the photodiode 30 and be conditioned and supplied to a control system. In response, the signal can be used to trigger a shut off of fuel to the combustion chamber 14.

The photodiode 30 is mounted and electrically connected to a circuit board 32. The circuit board 32 can be supported within the sensor assembly 20 in any number of ways, such as through adhesives, mechanical fasteners, snap fit or locking means, etc. As such, the circuit board 32 is generally limited from inadvertently moving within the sensor assembly 20. A signal wire 42 can be electrically connected to the photodiode 30 and the circuit board 32. In an example, the signal wire 42 can receive the photocurrent from the photodiode 30. The signal wire 42 can transmit an electrical signal (e.g., the photocurrent) from the photodiode 30, with the electrical signal being indicative of a characteristic of the flame 12. As will be described in more detail below, a shield wire 120 can be connected to a photodiode ground (e.g., negative return, electrically grounded) at location 121. In such an example, the photodiode 30 and signal wire 42 may, thus, be electrically insulated/isolated from the housing 21 of the sensor assembly 20.

The sensor assembly 20 can include a seal assembly 40 for the flame sensor apparatus 10. It will be appreciated that while the seal assembly 40 is illustrated in association with a flame sensor apparatus 10 in this example, the seal assembly 40 is not so limited. Indeed, the seal assembly 40 can be incorporated in any number of environments, some of which may not include flame sensor environments. In the illustrated example, due to the photocurrent being relatively low (e.g., $10^{-10}$ amperes in some examples), the seal assembly 40 can be used to protect the signal wire 42 and the electrical signal. In an example, the seal assembly 40 can be sealed and backfilled with a gas, including a dry inert gas such as argon. By filling the seal assembly 40 with the gas, the seal assembly 40 limits and reduces the entrance of moisture, condensation, gases, etc. that may have a deleterious effect on the electrical signal transmitted by the signal wire 42.

It is to be appreciated that the seal assembly 40 is illustrated somewhat generically/schematically, as the seal assembly 40 includes any number of constructions, sizes, shapes, etc. For example, the seal assembly 40 can be attached to and/or sealed with respect to internal structures within the sensor assembly 20. In particular, the seal assembly 40 can be attached to and/or sealed with respect to the housing 21 and/or one or more walls, chambers, dividers, etc. that are located within the sensor assembly 20.

Turning now to the structure of the seal assembly 40, the seal assembly 40 can include a first shield tube 50. The first shield tube 50 can surround the signal wire 42. The first shield tube 50 is an elongated, generally cylindrically shaped structure that extends axially within the sensor assembly 20. In other examples, however, the first shield tube 50 is not limited to including a cylindrical shape, and may include other shapes, such as ovoid shapes, quadrilateral shapes, or the like. The first shield tube 50 can include any number of conductive materials, including nickel, copper, or the like. In one possible example, the first shield tube 50 includes a braided cable. In other examples, the first shield tube 50 is generally a solid tube due to being in relatively close proximity to the signal wire 42 and since there is no insulator to keep the first shield tube 50 separated from contacting the signal wire 42.

The first shield tube 50 extends towards an end 52. In an example, the first shield tube 50 is substantially hollow, and defines a first interior 54 through which the signal wire 42 extends. In some examples, the first interior 54 may not be sealed so as not to create a hermetic barrier. The first shield tube 50 may be fully enclosed within the hermetic boundaries defined by the housing 21 and insulating barrier 70.

The seal assembly 40 can include a second shield tube 60. The second shield tube 60 can surround the signal wire 42. In one possible example, the second shield tube 60 is generally identical in structure to the first shield tube 50. The second shield tube 60 is an elongated, generally cylindrically shaped structure that extends axially within the sensor assembly 20. In other examples, however, the second shield tube 60 is not limited to including a cylindrical shape, and may include other shapes, such as ovoid shapes, quadrilateral shapes, or the like. The second shield tube 60 can include any number of conductive materials, including nickel, copper, or the like. In one possible example, the second shield tube 60 includes a braided cable.

The second shield tube 60 includes an end 62 that is spaced apart from the end 52 of the first shield tube 50. In one possible example, the second shield tube 60 and the first shield tube 50 can extend generally coaxially with respect to each other, with the signal wire 42 extending along a center axis. In other examples, however, the first shield tube 50 and second shield tube 60 can be at least partially offset from each other. The second shield tube 60 is substantially hollow, and defines a second interior 64 through which the signal wire 42 extends. In an example, the second shield tube 60 may not define/maintain a hermetic volume, as the second shield tube 60 may not be hermetically attached/sealed to insulating barrier 70.

The seal assembly 40 can include an electrically insulating barrier 70 positioned between the first shield tube 50 and the second shield tube 60, with the signal wire 42 extending through the insulating barrier 70. According to some examples, the insulating barrier 70 may be impermeable to gases. The insulating barrier 70 may extend radially across the first shield tube 50 and second shield tube 60 to define an inner edge 72. The inner edge 72 can be attached and/or hermetically sealed within the sensor assembly 20, such as by being attached and/or hermetically sealed to an internal surface of the housing 21 of the sensor assembly 20. The insulating barrier 70 includes any number of sizes/shapes. In this example, the insulating barrier 70 can have a generally circular shape, though, in other examples, may include ovoid shapes, quadrilateral shapes, or the like.

The insulating barrier 70 can define a first side 76 and an opposing second side 78. In an example, the first shield tube 50 is connected to the first side 76 of the insulating barrier 70 while the second shield tube 60 is connected to the second side 78 of the insulating barrier 70. The first side 76 of the insulating barrier 70 can face in a direction towards the photodiode 30 and circuit board 32 while the second side 78 of the insulating barrier 70 can face in a direction away from the photodiode 30 and circuit board 32 and towards the cable assembly 24. The insulating barrier 70 includes any number of materials that provide at least some degree of electrical insulation. For example, the insulating barrier 70 may include a material that is relatively high in resistance while allowing for a relatively low/negligible amount of gas to pass through. As such, in some examples, the insulating barrier 70 includes a glass material, ceramic material, or the like.

The insulating barrier 70 includes a wire opening 90. The wire opening 90 can extend through a center portion 92 of the insulating barrier 70. In an example, the signal wire 42 can extend through the wire opening 90 in the insulating barrier 70, with the signal wire 42 sealed with respect to the insulating barrier 70. In some examples, the signal wire 42 is hermetically sealed with respect to the insulating barrier 70, such that air, gas, etc. is limited from passing through the wire opening 90. As such, in this example, the second side 78 of the insulating barrier 70 is hermetically sealed with respect to the first side 76, such that air, gas, moisture, etc. is generally limited from passing through the wire opening 90.

The insulating barrier 70 can include a first conductive layer 100 on the first side 76 of the insulating barrier 70. In an example, the first conductive layer 100 can be applied/attached to the first side 76 of the insulating barrier 70 while extending circumferentially around the signal wire 42. The first conductive layer 100 includes any number of conductive materials, including nickel, copper, or the like. In an example, the first conductive layer 100 may be attached to a portion of the first side 76, but not all of the insulating barrier 70. As such, at least some of the insulating barrier 70, such as the center portion 92, is not covered by the first conductive layer 100. The first conductive layer 100 can be applied in any number of ways to the first side 76, including by coating, spraying, painting, depositing, etc.

The insulating barrier 70 can include a second conductive layer 102 on the second side 78 of the insulating barrier 70. In an example, the second conductive layer 102 can be applied/attached to the second side 78 of the insulating barrier 70 while extending circumferentially around the signal wire 42. The second conductive layer 102 includes any number of conductive materials, including nickel, copper, or the like. In an example, the second conductive layer 102 may be attached to a portion of the second side 78, but not all of the insulating barrier 70. As such, at least some of the insulating barrier 70, such as the center portion 92, is not covered by the second conductive layer 102. The second conductive layer 102 can be applied in any number of ways to the first side 76, including by coating, spraying, painting, depositing, etc.

In one possible example, the first shield tube 50 may electrically connected to the first conductive layer 100. However, as will be described in more detail below, electrical connection directly between the first shield tube 50 and first conductive layer 100 is not required. The first shield tube 50 and first conductive layer 100 can be electrically connected in any number of ways, such as by brazing, welding, soldering, or other suitable methods. Likewise, in one possible example, the second shield tube 60 may be electrically connected to the second conductive layer 102. In particular, the end 62 of the second shield tube 60 may be electrically connected to the second conductive layer 102. The second shield tube 60 and second conductive layer 102 can be electrically connected in any number of ways, such as by brazing, welding, soldering, or other suitable methods. However, as will be described in more detail below, electrical connection directly between the second shield tube 60 and second conductive layer 102 is not required.

The insulating barrier 70 can, in some examples, include a shaped profile 110. In the illustrated example, the shaped profile 110 of the insulating barrier 70 is non-linear and may include a V-shape. The shaped profile 110 can extend circumferentially around the center portion 92 and the signal wire 42. The shaped profile 110 can include, for example, a first wall 112 and a second wall 114. The first wall 112 is located radially outwardly from the second wall 114. As such, the second wall 114 is in closer proximity to the signal wire 42 than the first wall 112. In this example, the first wall 112 forms an acute angle (e.g., less than 90°) with respect to the second wall 114. The second wall 114 extends non-linearly with respect to the center portion 92, and can extend at an angle with respect to the center portion 92.

It will be appreciated that the insulating barrier 70 is not limited to the illustrated shape of the shaped profile 110 of FIG. 2. Indeed, any number of shaped profiles 110 are envisioned. In one possible example, the shaped profile 110 can be substantially planar (e.g., extend generally linearly), such that the center portion 92 and the shaped profile 110 are generally co-planar with respect to each other. In other examples, the shaped profile 110 can include curved shapes, rounded shapes, W-shapes, or the like. Indeed, in at least one possible example, no straight line can extend from a point exterior to the housing 21 of the sensor assembly 20 to the signal wire 42 without crossing through a shield tube (e.g., first shield tube 50 or second shield tube 60) or a conductive layer (e.g., first conductive layer 100 and second conductive layer 102).

In an example, the shield wire 120 can electrically connect the first shield tube 50 and the second shield tube 60 with a first conductive layer 100 and a second conductive layer 102. As such, these components (e.g., the first shield tube 50, the second shield tube 60, the first conductive layer 100, the second conductive layer 102, and the shield wire 120) can be held/maintained at the same electrical potential, such that radio frequency (RF) protection is provided. In these examples, due to the photodiode 30 (e.g., or other signal device) being grounded with respect to this electrical shielding configuration (e.g., first shield tube 50, second shield tube 60, first conductive layer 100, second conductive layer 102, and shield wire 120), the signal wire 42 may be protected from false signal generation due, at least in part, to radio frequency (RF) noise.

The seal assembly 40 can include the shield wire 120. In some examples, the shield wire 120 is attached to at least one of the first shield tube 50 and/or the second shield tube 60, with the shield wire 120 extending through the insulating barrier 70. In the illustrated example, the shield wire 120 is electrically connected to at least one of the first shield tube 50, the second shield tube 60, the first conductive layer 100 and/or the second conductive layer 102. The shield wire 120 includes a conductive material, such that current can flow through the shield wire 120.

The shield wire 120 can extend through an opening, hole, or the like formed in the insulating barrier 70. For example, the shield wire 120 can extend through the shaped profile 110, including either the first wall 112 or the second wall 114. By passing through the shaped profile 110, the shield wire 120 can contact and electrically connect to the first conductive layer 100 and second conductive layer 102. In some examples, the shield wire 120 is hermetically sealed with respect to the insulating barrier 70. As such, air, gas, etc. is limited from passing through the insulating barrier 70 between the first side 76 and the second side 78.

In further examples, it is to be appreciated that the first shield tube 50 may or may not directly contact the first conductive layer 100. Likewise, in some examples, the second shield tube 60 may or may not directly contact the second conductive layer 102. In either of these examples, the first shield tube 50 may not directly contact the first conductive layer 100 while the second shield tube 60 may not directly contact the second conductive layer 102 provided that the shield wire 120 electrically contacts each of the first shield tube 50, second shield tube 60, first conductive layer 100 and second conductive layer 102. Accordingly, due to the shield wire 120 electrically contacting the shield tubes and conductive layers, each of the shield wire 120, first shield tube 50, second shield tube 60, first conductive layer 100 and second conductive layer 102 may be maintained at an equipotential.

Figure 3:
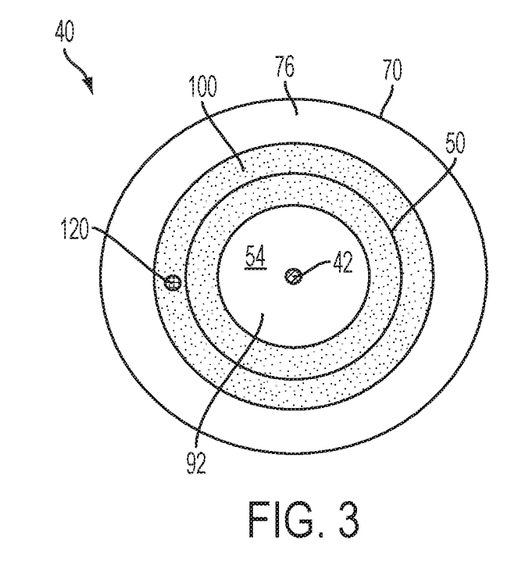
FIG. 3 is a top down view of the example seal assembly along lines 3-3 of FIG. 2.

Turning now to FIG. 3, a top down view of the seal assembly 40 is illustrated along lines 3-3 of FIG. 2. In this example, the first shield tube 50, first interior 54, first side 76 of the insulating barrier 70 and the first conductive layer 100 are illustrated. It will be appreciated that while the second shield tube 60, second interior 64, second conductive layer 102 are not illustrated, their respective positions will substantially match the illustrated positions of the first shield tube 50, first interior 54, first conductive layer 100, etc. of FIG. 3.

In this example, the insulating barrier 70 can have a generally rounded shape. The first conductive layer 100 is applied to the first side 76 of the insulating barrier 70, such that the first conductive layer 100 extends circumferentially around the signal wire 42. The shield wire 120 can extend through the insulating barrier 70 (e.g., through the shaped profile 110 as illustrated in FIG. 2). As such, the shield wire 120 can be electrically connected to the first conductive layer 100 and the second conductive layer 102.

The first shield tube 50 has a generally rounded, cylindrical shape and extends from the first conductive layer 100. The first shield tube 50 defines the first interior 54 through which the signal wire 42 extends. The first shield tube 50 and second shield tube 60 can extend substantially continuously along the signal wire 42, such that the signal wire 42 is generally protected from moisture, condensation, gases, etc. The signal wire 42 may be hermetically sealed with respect to the insulating barrier 70 at the location where the signal wire 42 passes through the wire opening 90. Similarly, the shield wire 120 may be hermetically sealed with respect to the insulating barrier 70 at the location where the shield wire 120 passes through the insulating barrier 70.

In operation, referring to FIGS. 2 and 3, the signal wire 42 is electrically connected to the photodiode 30 (e.g., through the circuit board 32). The signal wire 42 can transmit an electrical signal from the photodiode that is indicative of a characteristic of the flame 12. Due to the electrical signal (e.g., photocurrent) being relatively small, the signal wire 42 is contained within the first shield tube 50 and second shield tube 60. The first shield tube 50, defining the first interior 54, and second shield tube 60, defining the second interior 64, can limit the ingress of moisture, condensation, particulates, etc., that may have a negative effect on the electrical signal transmitted by the signal wire 42.

Additionally, the first shield tube 50 and second shield tube 60 can shield the signal wire 42 from interference (e.g., electromagnetic, RF, etc.). In an example, the first shield tube 50, second shield tube 60, first conductive layer 100, second conductive layer 102, and/or the shield wire 120 are grounded and, as such, are electrically insulated from the signal wire 42. In such an example, the signal wire 42 is partially or completely shielded from interference (e.g., electromagnetic, RF, etc.) and/or any electrical noise that may be present at an exterior of the first shield tube 50 and/or second shield tube 60.

In general, the seal assembly 40 provides a number of benefits. In particular, the seal assembly 40 provides for an interface/connection between the first shield tube 50 and the first side 76 of the insulating barrier 70. Likewise, the seal assembly 40 provides for an interface/connection between the second shield tube 60 and the second side 78 of the insulating barrier 70. In this example, the shield wire 120 can act as a single point conductor connecting the electrical path (e.g., first shield tube 50/first conductive layer 100 and second shield tube 60/second conductive layer 102) on both sides (e.g., first side 76 and second side 78) of the insulating barrier 70.

The configuration described herein provides a manufacturability advantage over other designs. In particular, a smaller conductor/insulator interface allows for relatively fewer stresses to be generated due to mismatch(es) between thermal coefficient(s) of expansion. This reduction of stresses at the conductor/insulator interface means that the likelihood of cracks (e.g., due to stress) that can result in a gas leakage path is also reduced. As such, a more robust seal design is provided. The seal assembly 40 allows for only one insulator (e.g., insulating barrier 70) instead of two insulators that are separated by a shield tube that penetrates fully through the insulating layer and must be kept hermetically sealed on both the interior and exterior surfaces between the shield tube and insulators, as is common in past designs.

Moreover, since a relatively small portion of the shield wire 120 penetrates through the insulating barrier 70, a hermetic seal between the shield wire 120 and the insulating barrier 70 can be formed, thus limiting the passage of air, gas, moisture, etc. between the first side 76 and the second side 78. Similarly, a hermetic seal may be formed between the signal wire 42 and the insulating barrier 70, also limiting the passage of air, gas, moisture, etc. Accordingly, the risk of breaking the hermetic seal (e.g., due to mismatches between the coefficients of thermal expansion (CTE) between an insulator material (e.g., glass) and a conductor (e.g., metal)) is reduced because the contact surface area between the conductor/insulator interface is reduced and is relatively small in comparison to past seal designs.

The invention has been described with reference to the example embodiments described above. Modifications and alterations will occur to others upon a reading and understanding of this specification. Example embodiments incorporating one or more aspects of the invention are intended to include all such modifications and alterations insofar as they come within the scope of the appended claims.

What is claimed is:

1. An arrangement for connecting a sensor assembly and a cable assembly, the arrangement comprising:
    a signal wire being configured to convey a signal from the sensor assembly to the cable assembly;
    an insulating barrier extending transverse to the signal wire, the signal wire extending through a center portion in the insulating barrier, the insulating barrier being at least part of a boundary separation between the sensor assembly and the cable assembly;
    a shield wire being configured to provide at least part of a grounding pathway between the sensor assembly and the cable assembly, the shield wire extending through the insulating barrier at a location spaced from the signal wire; and
    at least one conductive layer located upon the insulating barrier, the at least one conductive layer being spaced away from the signal wire and being in electrical contact with the shield wire;
    at least a portion of the insulating barrier having a non-linear profile with respect to the center portion wherein the at least a portion of the insulating barrier extends non-planar with respect to the center portion, and at least a portion of the at least one conductive layer being located upon the at least a portion of the insulating barrier having the non-linear profile.

2. The arrangement as set forth in claim 1, wherein the at least a portion of the insulating barrier having a non-linear profile is contoured.

3. The arrangement as set forth in claim 2, wherein the contour of the at least a portion of the insulating barrier having the non-linear profile includes a shape profile having at least one direction change.

4. The arrangement as set forth in claim 3, wherein the shape profile having at least one direction change includes a V-shape profile.

5. The arrangement as set forth in claim 3, wherein the shape profile having at least one direction change includes a W-shape profile.

6. The arrangement as set forth in claim 1, wherein the at least a portion of the insulating barrier having a non-linear profile is non-planar.

7. The arrangement as set forth in claim 6, wherein the at least a portion of the insulating barrier having the non-linear profile includes at least one direction change to be non-planar.

8. The arrangement as set forth in claim 6, wherein the at least a portion of the insulating barrier having the non-linear profile includes at least a V-shape profile to be non-planar.

9. The arrangement as set forth in claim 6, wherein the at least a portion of the insulating barrier having the non-linear profile includes at least a W-shape profile to be non-planar.

10. The arrangement as set forth in claim 1, wherein the at least one conductive layer includes a first conductive layer and a second conductive layer, the first conductive layer is located upon a first side of the insulating barrier, and the second conductive layer is located upon a second side of the insulating barrier.

11. The arrangement as set forth in claim 1, further including
    a first shield tube surrounding a first portion of the signal wire adjacer o a first side of the insulating barrier;
    a second shield tube surrounding a second portion of the signal wire adjacent to a second side of the insulating barrier, the insulating barrier being positioned between the first shield tube and the second shield tube; and
    a housing enclosing at least the first shield tube and the first portion of the signal wire adjacent to a first side of the insulating barrier.

12. The arrangement as set forth in claim 11, wherein the at least one conductive layer includes a first conductive layer and a second conductive layer, the first conductive layer is located upon the first side of the insulating barrier, and the second conductive layer is located upon the second side of the insulating barrier.

13. The arrangement as set forth in claim 12, wherein at least the first shield tube, the first conductive layer and the second conductive layer are configured such that no straight line can extend from the housing to the first portion of the signal wire that is adjacent to a first side of the insulating barrier without crossing through at least the first shield tube, the first conductive layer or the second conductive layer.

14. The arrangement as set forth in claim 1, wherein the shield wire and the at least one conductive layer are configured to be at a same electrical potential to provide interference protection to the signal wire.

15. The arrangement as set forth in claim 14, wherein the shield wire and the at least one conductive layer are configured to be at a same electrical potential to provide radio frequency interference protection to the signal wire.

16. The arrangement as set forth in claim 14, wherein the at least one conductive layer includes a first conductive layer and a second conductive layer, the first conductive layer is located upon a first side of the insulating barrier, the second conductive layer is located upon a second side of the insulating barrier, and the shield wire, the first conductive layer and the second conductive layer are electrically connected together and are configured to be at a same electrical potential to provide interference protection to the signal wire.

17. The arrangement as set forth in claim 16, wherein the shield wire, the first conductive layer and the second conductive layer are configured to be at a same electrical potential to provide radio frequency interference protection to the signal wire.

18. The arrangement as set forth in claim 14, further including:
    a first shield tube surrounding a first portion of the signal wire adjacent o a first side of the insulating barrier; and a second shield tube surrounding a second portion of the signal wire adjacent to a second side of the insulating barrier, the insulating barrier being positioned between the first shield tube and the second shield tube;

the shield wire, the at least one conductive layer, the first shield tube and the second shield tube are electrically connected together and are configured to be at a same electrical potential to provide interference protection to the signal wire.

19. The arrangement as set forth in claim 18, wherein the shield wire, the at least one conductive layer, the first shield tube and the second shield tube are configured to be at a same electrical potential to provide radio frequency interference protection to the signal wire.

\* \* \* \* \*

UNITED STATES PATENT AND TRADEMARK OFFICE
CERTIFICATE OF CORRECTION

PATENT NO. : 9,788,414 B2
APPLICATION NO. : 15/298332
DATED : October 10, 2017
INVENTOR(S) : James Michael Lustig

Page 1 of 1

It is certified that error appears in the above-identified patent and that said Letters Patent is hereby corrected as shown below:

Column 10, Line 20, please delete the words "adjacer o" and insert therefor --adjacent to--, Column 10, Line 67, please delete the word "o" and insert therefor --to--.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*